United States Patent [19]

Johannsmeier

[11] 3,865,254

[45] Feb. 11, 1975

[54] PREALIGNMENT SYSTEM FOR AN OPTICAL ALIGNMENT AND EXPOSURE INSTRUMENT

[75] Inventor: Karl-Heinz Johannsmeier, Mountain View, Calif.

[73] Assignee: Kasker Instruments Inc., Mountain View, Calif.

[22] Filed: May 21, 1973

[21] Appl. No.: 362,447

[52] U.S. Cl. .......... 214/1 BH, 198/257, 214/1 BE, 355/78

[51] Int. Cl. .......... B65g 47/24

[58] Field of Search.... 214/1 BH, 1 BE; 198/33 AB, 198/257, 355/78, 91

[56] References Cited

UNITED STATES PATENTS

| | | | |
|---|---|---|---|
| 3,109,530 | 11/1963 | McPherson | 198/33 AB |
| 3,198,311 | 8/1965 | Lajoie | 214/1 BH |
| 3,552,584 | 1/1971 | Heinrich | 214/1 BH |

*Primary Examiner*—Robert J. Spar
*Assistant Examiner*—George F. Abraham
*Attorney, Agent, or Firm*—Roland I. Griffin

[57] ABSTRACT

An optical alignment and exposure instrument is provided with a first air bearing track for transporting a semiconductive wafer from a first magazine to a prealignment platform. The prealignment platform is pivotally mounted for tilting the semiconductive wafer into engagement with a stop member mounted on the prealignment platform and a plurality of drive rollers that automatically orient the semiconductive wafer in a prealigned position against the stop member. Apertures are provided in the prealignment platform and selectively connected to a source of vacuum and a source of air so that the semiconductive wafer may be vacuum clamped to the prealignment platform while the prealignment platform is being tilted, may be supported on an air cushion during the prealignment operation, and may then be vacuum clamped in the prealigned position while the prealignment platform is returned to its normal untilted position. The optical alignment and exposure instrument is also provided with a transfer arm having a vacuum cup at one end thereof for picking up the prealigned semiconductive wafer and transferring it to a wafer chuck where it is further aligned with a photomask and then exposed through the photomask. Apertures are also provided in the wafer chuck and selectively connected to the source of vacuum and the source of air so that the prealigned semiconductive wafer may be vacuum clamped in place on the wafer chuck during these alignment and exposure operations and may then be transferred on an air cushion to a second air bearing track employed for transporting the exposed semiconductive wafer to a second magazine.

26 Claims, 8 Drawing Figures

PREALIGNMENT SYSTEM FOR AN OPTICAL ALIGNMENT AND EXPOSURE INSTRUMENT

BACKGROUND OF THE INVENTION

This invention relates generally to optical alignment and exposure instruments and more particularly to an improved prealignment system for use therein.

Optical alignment and exposure instruments are commonly used in the present day manufacture of integrated circuits to align a semiconductive wafer with a photomask and then to expose a photosensitive film on the semiconductive wafer through the photomask in accordance with the well known photo-resist technique for producing a desired circuit pattern on the semiconductive wafer. One such instrument is shown and described in U.S. Pat. NO. 3,490,846 issued on Jan. 20, 1970, to Goetz H. Kasper. These instruments are typically provided with an optical alignment stage including a wafer chuck for holding the semiconductive wafer in an aligned position relative to the photomask, which defines the desired circuit pattern to be produced on the semiconductive wafer. Since several different photomasks must normally be successively employed in fabricating integrated circuits from the semiconductive wafer, each successive photomask must be precisely aligned with the circuit pattern or patterns previously produced on the semiconductive wafer. In accordance with one technique utilized to accomplish this precise alignment, the operator of the optical alignment and exposure instrument views the photomask and the semiconductive wafer, which is randomly positioned on the wafer chuck, through a microscope while positioning the wafer chuck by means of a movable X–Y stage to completely align the semiconductive wafer with the photomask. This procedure is relatively slow and tedious.

Semiautomatic prealignment systems have been utilized wherein the operator manually orients the semiconductive wafer in a prealigned position on a prealignment stage and thereafter utilizes mechanical means to move the prealigned semiconductive wafer onto the wafer chuck in the proper position for final alignment with the photomask. To orient the semiconductive wafer in the prealigned position on the prealignment stage, the operator places a flat portion of the peripheral edge of the semiconductive wafer against a mating flat surface on the prealignment stage. In accordance with one semiautomatic prealignment system, a plurality of wafer chucks is provided on a lazy susan turntable for successively rotating each wafer chuck between a loading position at which the operator manually prealigns a semiconductive wafer thereon and an alignment position at which the prealigned semiconductive wafer may be further aligned with and exposed through the photomask to produce the circuit pattern defined by the photomask upon the semiconductive wafer. All of these semiautomatic prealignment systems require that the operator manually prealign the semiconductive wafer at the prealignment stage, thereby requiring his attention during each prealignment cycle in the process of fabricating integrated circuits from the semiconductive wafer.

Automatic prealignment systems have been provided wherein semiconductive wafers are automatically delivered one at a time from a magazine holding a number of semiconductive wafers to a prealignment stage including provision for automatically aligning the flat portion of the peripheral edge of each semiconductive wafer with a prealignment position on the prealignment stage and thereafter delivering each prealigned semiconductive wafer to the wafer chuck. These automatic prealignment systems do not require the full attention of an operator to perform the prealignment operation. In one such system, the prealignment stage is provided with a plurality of air jets which rotate the semiconductive wafer delivered to the prealignment stage to bring the semiconductive wafer to the prealignment position. Optical detectors sense optical response indicia on the semiconductive wafer when it is brought to the prealignment position. In response to this sensing of the optical response indicia by the optical detectors, the flow of air to the air jets is terminated. Since it is difficult to precisely control termination of the flow of air to the air jets in response to optical sensing, the semiconductive wafer occasionally overshoots the prealignment position. The semiconductive wafer is particularly prone to overshoot the prealignment position when the air jets rotate it approximately a full turn since it then has more speed than when it is rotated only a quarter turn or so.

SUMMARY OF THE INVENTION

In accordance with the present invention there is provided an improved automatic prealignment system wherein a semiconductive wafer delivered to the prealignment system in a randomly aligned manner is automatically prealigned with respect to a photomask and is then automatically delivered in the prealigned position to an optical alignment stage where the semiconductive wafer and the photomask are brought into final optical alignment. The prealignment system operates in a substantially fully mechanical manner to orient the semiconductive wafer in the prealigned position without the aforementined and other disadvantages of the prior art prealignment systems.

In a preferred embodiment of the present invention, the prealignment system comprises a prealignment platform to which the semiconductive wafer is first delivered and a drive mechanism comprising a plurality of drive rollers positioned near a peripheral portion of the prealignment platform. The prealignment platform is pivotally mounted so that it may be tilted in a direction causing the semiconductive wafer to move towards and into engagement with the drive rollers and a stop member mounted on the prealignment platform. A first one of the driver rollers is driven in one rotary direction while second and third ones of the drive rollers are driven in the opposite rotary direction. These drive rollers are arranged to drive the semiconductive wafer in one rotary direction until the semiconductor wafer reaches the desired prealigned position at which a rounded portion of the peripheral edge of the semiconductive wafer rests against a stop member and the flat portion of the peripheral edge of the semiconductive wafer engages both the first and third drive rollers. The semiconductive wafer is then driven in opposite directions by the first and third drive rollers and therefore remains stationary in the prealigned position on the prealignment platform and selectively connected to a source of vacuum and a source of air so that the semiconductive wafer may be vacuum clamped to the prealignment platform while it is being tilted, may be supported on an air cushion during the prealignment operation to remove the friction between the semiconductive wafer and the prealignment and platform and thereby facilitate movement of the semiconductive wafer on the prealignment platform to the prealigned position, and may thereafter be vacuum clamped in the prealigned position while the prealignment platform is returned to its normal untilted position.

After the prealignment operation, the prealigned semiconductive wafer is transferred from the prealignment platform to a wafer chuck of the optical alignment stage. This is accomplished by a transfer arm pivotally mounted at one end for movement between the prealignment platform and the wafer chuck and provided at the other end with a vacuum pickup cup for picking up the prealigned semiconductive wafer at the prealignment platform and transporting it in the prealigned position to the wafer chuck where it is deposited in the prealigned position.

DESCRIPTION OF THE PREFERRED EMBODIMENT

Figure 1:
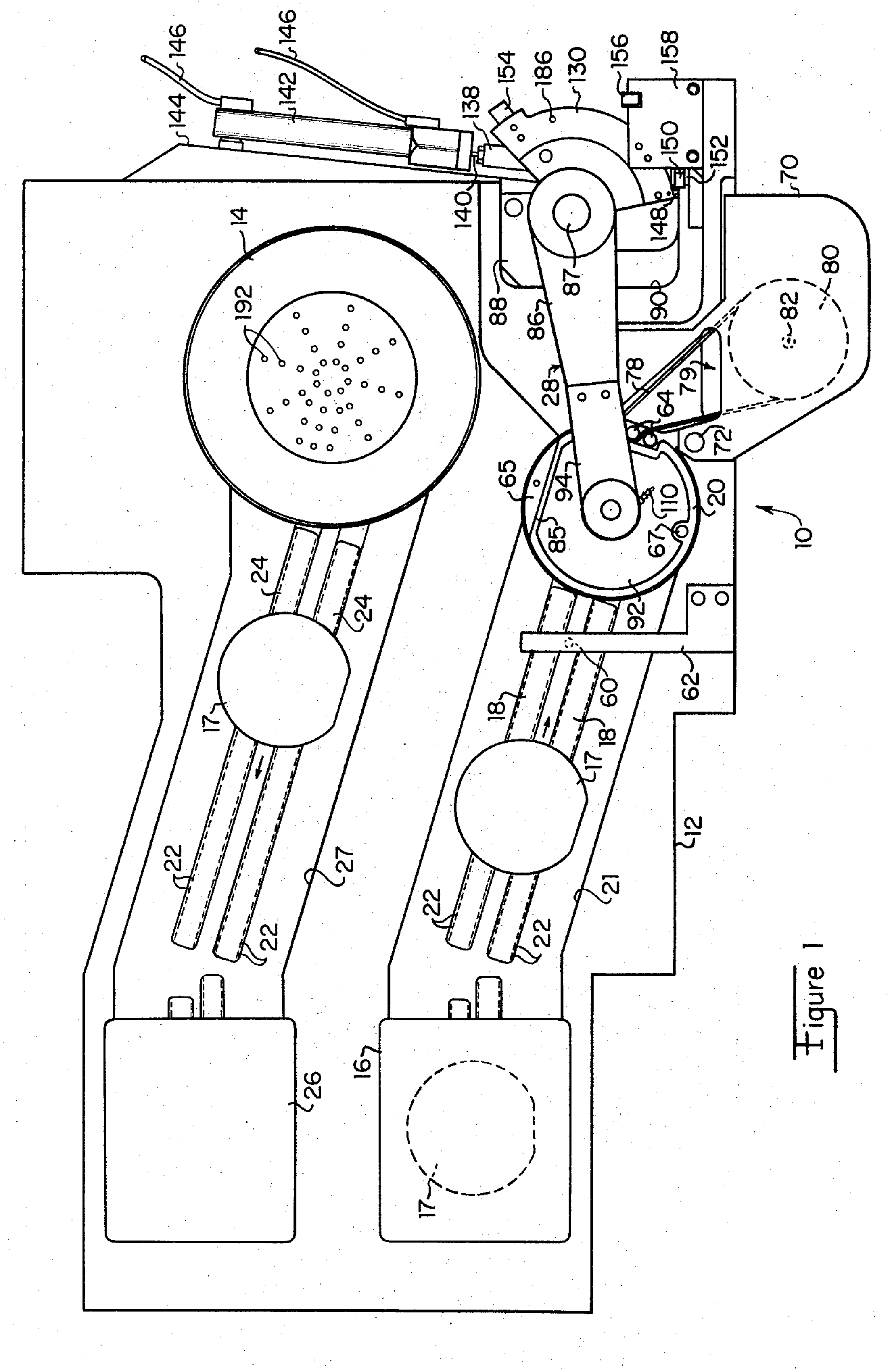
FIG. 1 is a plan view of a prealignment system according to the preferred embodiment of this invention with the transfer arm assembly in the wafer pickup position.
Figure 2:
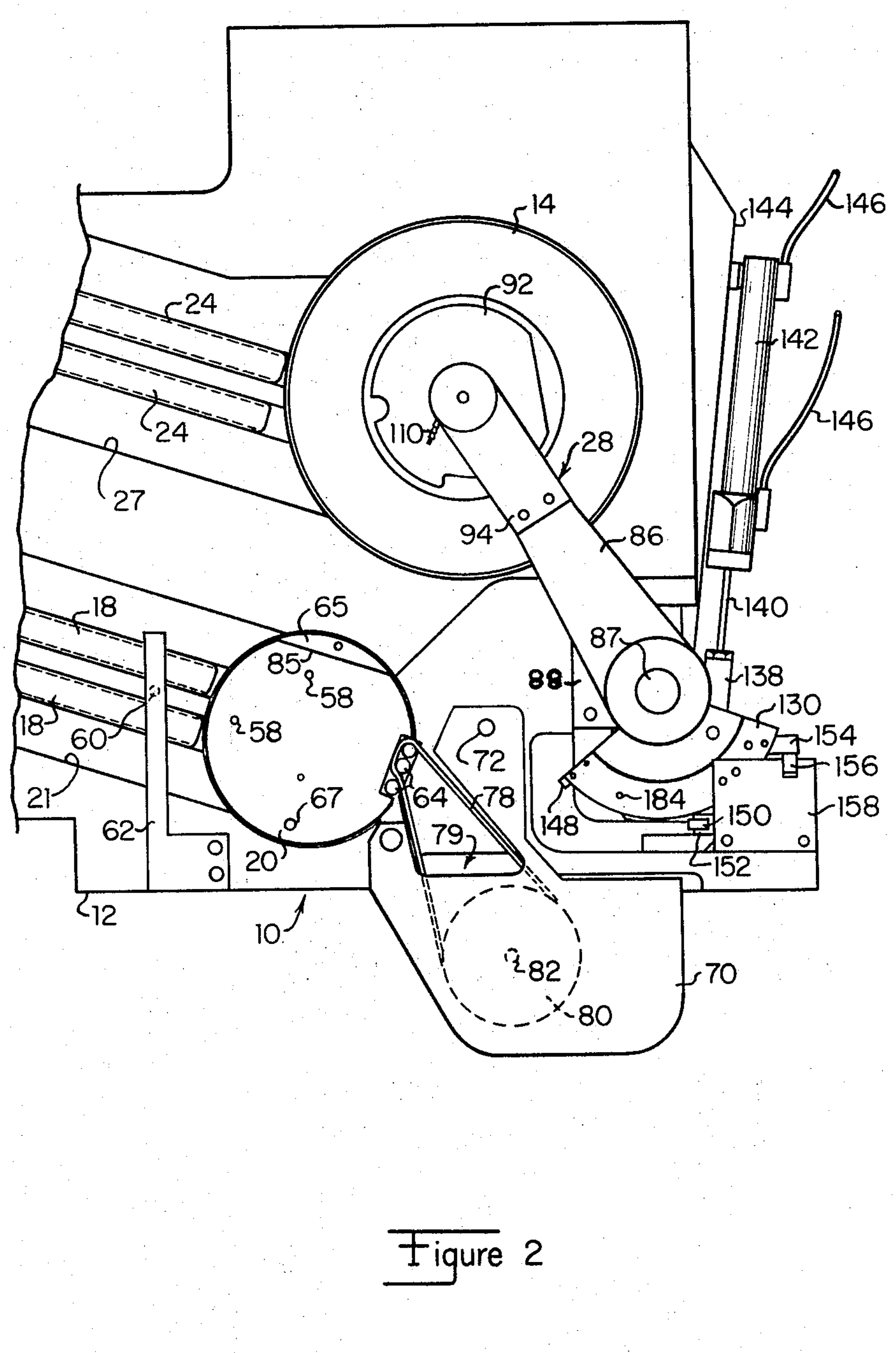
FIG. 2 is a plan view of the prealignment system of FIG. 1 with the transfer arm assembly in the wafer delivery position.

Referring now to FIGS. 1 and 2, there is shown an improved automatic prealignment system 10 that may be used in an optical alignment and exposure instrument such as that shown and described, for example, in the aforementioned U.S. Pat. No. 3,490,846. This prealignment system is mounted on a base plate 12, which is in turn mounted with a wafer chuck 14 on the optical alignment stage of the instrument. As with known forms of automatic prealignment systems, a magazine 16 is provided for holding a plurality of semiconductive wafers 17 and for automatically feeding them one at a time to an air bearing track 18 leading to a prealignment platform 20. Air bearing track !8 is mounted in a recessed portion 21 of base plate 12 and provided with a plurality of air holes 22 along its length. A source of air is provided for delivering jets of air through these air holes to form a moving air cushion for carrying a semiconductive wafer 17 along air bearing track 18 from magazine 16 to a prealignment platform 20. A similar air bearing track 24 leading from wafer chuck 14 to another magazine 26 is mounted in another recessed portion 27 of base plate 12. Air bearing track 24 is also provided with air holes 22 along its length through which a moving air cushion is formed for carrying a semiconductive wafer 17, which has been aligned with and exposed through a photomask and then ejected from wafer chuck 14, to magazine 26 for storage therein. Thus, a plurality of, for example, twenty-five to sixty semiconductive wafers carried in magazine 16 may each be delivered to prealignment platform 20 for prealignment with respect to a photomask, then transferred by a transfer arm assembly 28 to wafer chuck 14 for final alignment with and exposure through the photomask, and thereafter delivered to magazine 26 for storage therein. All of these steps are performed in an automatic, unattended manner.

Figures 3, 6:
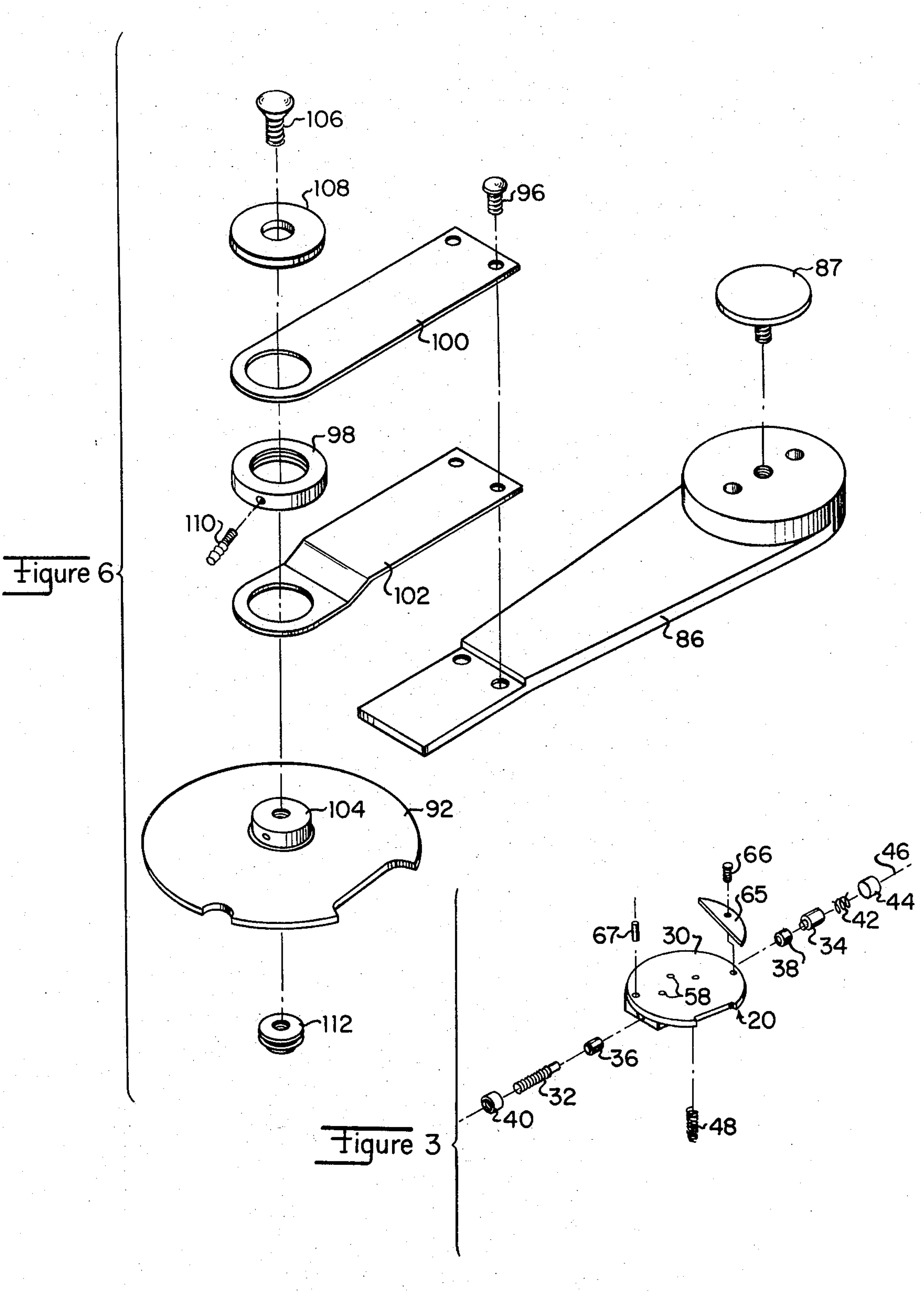
FIG. 3 is an exploded perspective view of the prealignment platform assembly of FIGS. 1 and 2.
FIG. 6 is an exploded perspective view of the transfer arm assembly of FIGS. 1 and 2.
Figure 4:
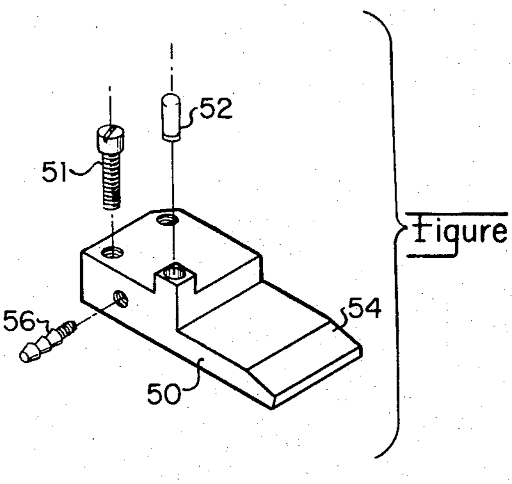
FIG. 4 is an exploded perspective view of the pivot stop block assembly for the prealignment platform of FIGS. 1, 2, and 3.

As best shown in FIGS. 1, 2, and 3, prealignment platform 20 comprises a circular plate 30 pivotally mounted within a circular opening in base plate 12 by pivot pins 32 and 34, which are supported by the base plate and engaged with bearing mounts 36 and 38, respectively, of the prealignment platform. Pivot pin 32 is externally threaded and screwed into an internally threaded bushing 40, while a compression spring 42 is positioned between pivot pin 34 and a spring plug 44. The position of prealignment platform 20 along mounting axis 46 may therefore be precisely adjusted by turning pivot pin 32. Another compression spring 48 is positioned between the lower surface of prealignment platform 20 and the upper surface of a pivot stop block 50, which is shown in FIG. 4 and is mounted by screws 51 on base plate 12 below the circular opening for the prealignment platform. Compression spring 48 is located on the right-hand side of mounting axis 46 so as to spring bias prealignment platform 20 to a horizontal untilted position at which the upper surface of the prealignment platform lies in the same plane as the upper surface of air bearing track 18. A semiconductive wafer 17 may therefore move in an unimpeded fashion from the air cushion of air bearing track 18 onto prealignment platform 20. In the untilted position, the lower surface of prealignment platform 20 rests upon a normally-retracted plunger 52 mounted in pivot stop block 50 on the left-hand side of mounting axis 46. Plunger 52 is raised to tilt prealignment platform 20 and thereby compress compression spring 48 against a portion 54 of the upper surface of pivot stop block 50 that is inclined at the same angle as the prealignment platform when the plunger is raised. This is accomplished by applying air pressure from the source of air to an air fitting 56 mounted on pivot stop block 50.

A plurality of apertures 58 is provided in the upper surface of prealignment platform 20 and is selectively connected to a source of vacuum and the source of air. An optical detector 60 comprising a photodiode is mounted in the recessed portion 21 of base plate 12 between the adjacent portions of air bearing track 18 and below a light source, which is supported above air bearing track 18 by a lamp holder 62. Optical detector 60 senses each semiconductive wafer 17 moved along air bearing track 18 past lamp holder 62 and, after a time delay sufficient for the semiconductive wafer to be moved onto prealignment platform 20, enables the source of vacuum to vacuum clamp the semiconductive wafer on the prealignment platform through apertures 58. This prevents the semiconductive wafer from impacting upon drive rollers 64, which are positioned adjacent to a recessed peripheral edge of prealignment platform 20, and bouncing back off the prealignment platform. After the aforementioned time delay, optical detector 60 also causes drive rollers 64 to begin rotating and enables the source of air to raise plunger 52 and thereby tilt prealignment platform 20 about its mounting axis 46 and in the general direction of the drive rollers. The vacuum applied to the semiconductive wafer is then removed to release the semiconductive wafer, and, at the same time, the source of air is enabled to produce an air cushion between the semiconductive wafer and prealignment platform 20 through apertures 58 thereby allowing the semiconductive wafer to float and move more easily on the prealignment platform. Since the prealignment platform has been tilted slightly towards drive rollers 64, the semiconductive wafer moves towards and into engagement with the drive rollers due to its own weight and as a result of gravity. Mounting axis 46 of prealignment platform 20 is also oriented at a slight angle with respect to drive rollers 64 so that when the prealignment platform is tilted, the semiconductive wafer also moves towards and into engagement with a stop member 65 secured by a screw 66 to a peripheral portion of the prealignment platform at substantially a right angle with respect to the drive rollers. A pin 67 is mounted on another peripheral portion of prealignment platform 20 opposite stop member 65 to help guide the semiconductive wafer onto the prealignment platform from air bearing track 18 and to help retain the semiconductive wafer on the prealignment platform.

Figure 5:
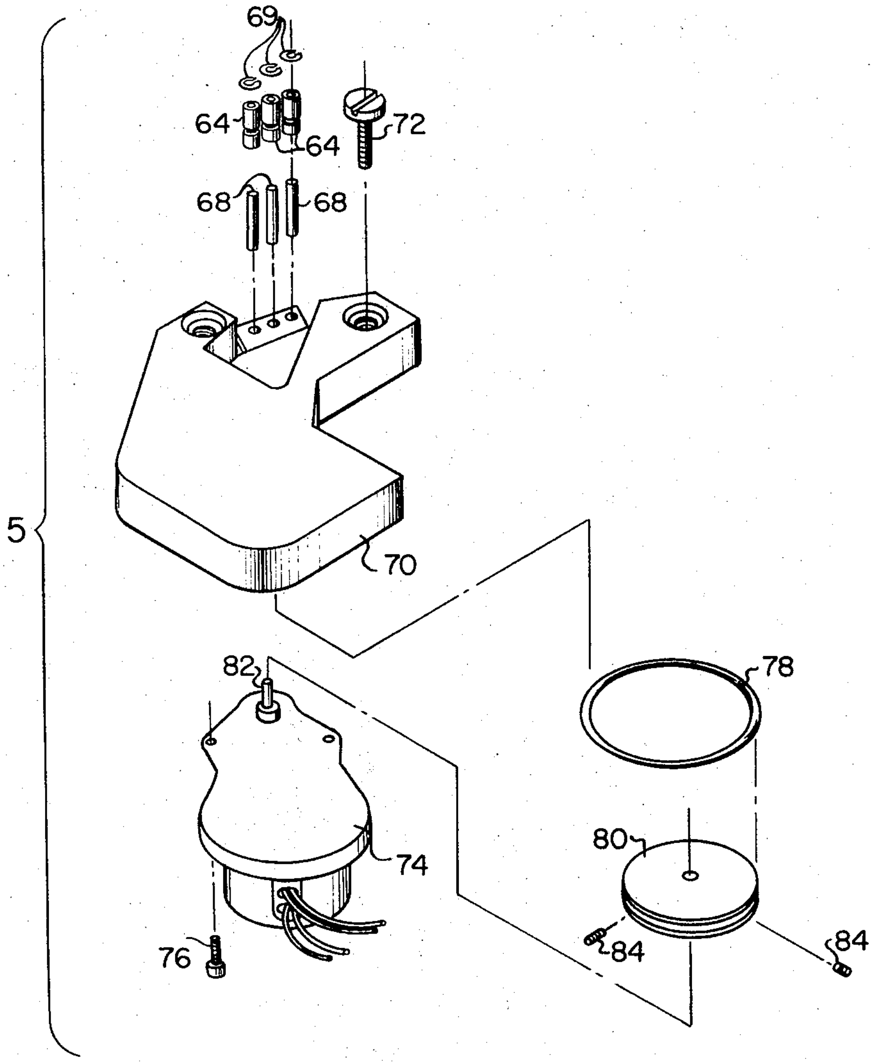
FIG. 5 is an exploded perspective view of the drive roller assembly of FIGS. 1 and 2.

As best shown in FIGS. 1, 2, and 5, drive rollers 64 comprise three spaced-apart idler rollers rotatably captivated on three shafts 68 by spring clips 69. These shafts 68 are in turn vertically mounted on a motor mount 70 attached to base plate 12 by screws 72. A drive motor 74 is attached to motor mount 70 by screws 76 and is coupled to drive rollers 64 by an O ring drive belt 78 passing through an opening 79 in motor mount 70. This drive belt engages drive rollers 64 and a pully 80, which is attached to drive shaft 82 of drive motor 74 by set screws 84, so that the left-hand outer drive roller rotates in a counterclockwise direction and the other two drive rollers both rotate in a clockwise direction. Since the semiconductive wafer is delivered to prealignment platform 20 in a random orientation, it will be assumed that the flat portion of the peripheral edge of the semiconductive wafer is not in alignment with drive rollers 64 and is oriented as indicated in FIG. 1. Drive rollers 64 are arranged so that the rounded portion of the peripheral edge of the semiconductive wafer therefore contacts the center drive roller and the right-hand outer drive roller, both of which rotate in the clockwise direction and rotate the semiconductive wafer in the counter-clockwise direction on the air cushion provided at prealignment platform 20. Rotating the semiconductive wafer in the counter-clockwise direction maintains the peripheral edge of the semiconductive wafer in engagement with a flat edge portion 85 of stop member 65 and in engagement with both the center drive roller and the right-hand outer drive roller. The semiconductive wafer therefore continues rotating on prealignment platform 20 until such time as the flat portion of the peripheral edge of the semiconductive wafer becomes aligned with the three drive rollers 64. In this position, at which the semiconductive wafer is prealigned with respect to the photomask, the flat portion of the peripheral edge of the semiconductive wafer engages both of the outer drive rollers, but not the center drive roller. Since the outer drive rollers tend to rotate the semiconductive wafer in opposite directions, the semiconductive wafer ceases to rotate and remains in the prealigned position with the flat portion of its peripheral edge in alignment with and against both of the outer drive rollers and with the rounded portion of its peripheral edge against the flat edge portion 85 of stop member 65. After a time delay sufficient to permit position from the most out-of-aligned position (i.e., a rotation of approximately 360°), the air cushion provided at prealignment platform 20 is terminated and the semiconductive wafer is again vacuum clamped to the prealignment platform in the prealigned position through apertures 58. Prealignment platform 20 is thereafter tilted back to its normal horizontal position by removing the air pressure applied to plunger 52 and by the resultant action of compression spring 48 (see FIGS. 3 and 4). Te semiconductive wafer is then held in readiness for movement by transfer arm assembly 28 from prealignment platform 20 to wafer chuck 14.

As best shown in FIGS. 1, 2, and 6, transfer arm assembly 28 comprises a transfer arm 86 pivotally secured at one end by a thumb screw 87 to a transfer arm mount assembly 88, which is in turn mounted on a recessed portion 90 of base plate 12. A vacuum pickup cup 92 is mounted on a spring assembly 94 attached to the other end of transfer arm 86 by screws 96. Spring assembly 94 comprises a spacer 98 positioned between an upper flat spring 100 and a lower flat spring 102 and coaxially secured in air-tight engagement with a hub 104 of vacuum pick-up cup 92 by a screw 106 and a clamp washer 108. An air fitting 110 is screwed into spacer 98 and the hub 104 of vacuum pickup cup 92 in communication with a flexible bellows-like pickup member 112, which is coaxially secured within the vacuum pickup cup by screw 106. Air fitting 110 is operatively connected to the source of vacuum when a semiconductive wafer on prealignment platform 20 is to be picked up and is operatively connected to the source of air when the semiconductive wafer is to be deposited on wafer chuck 14.

Figures 7, 8:
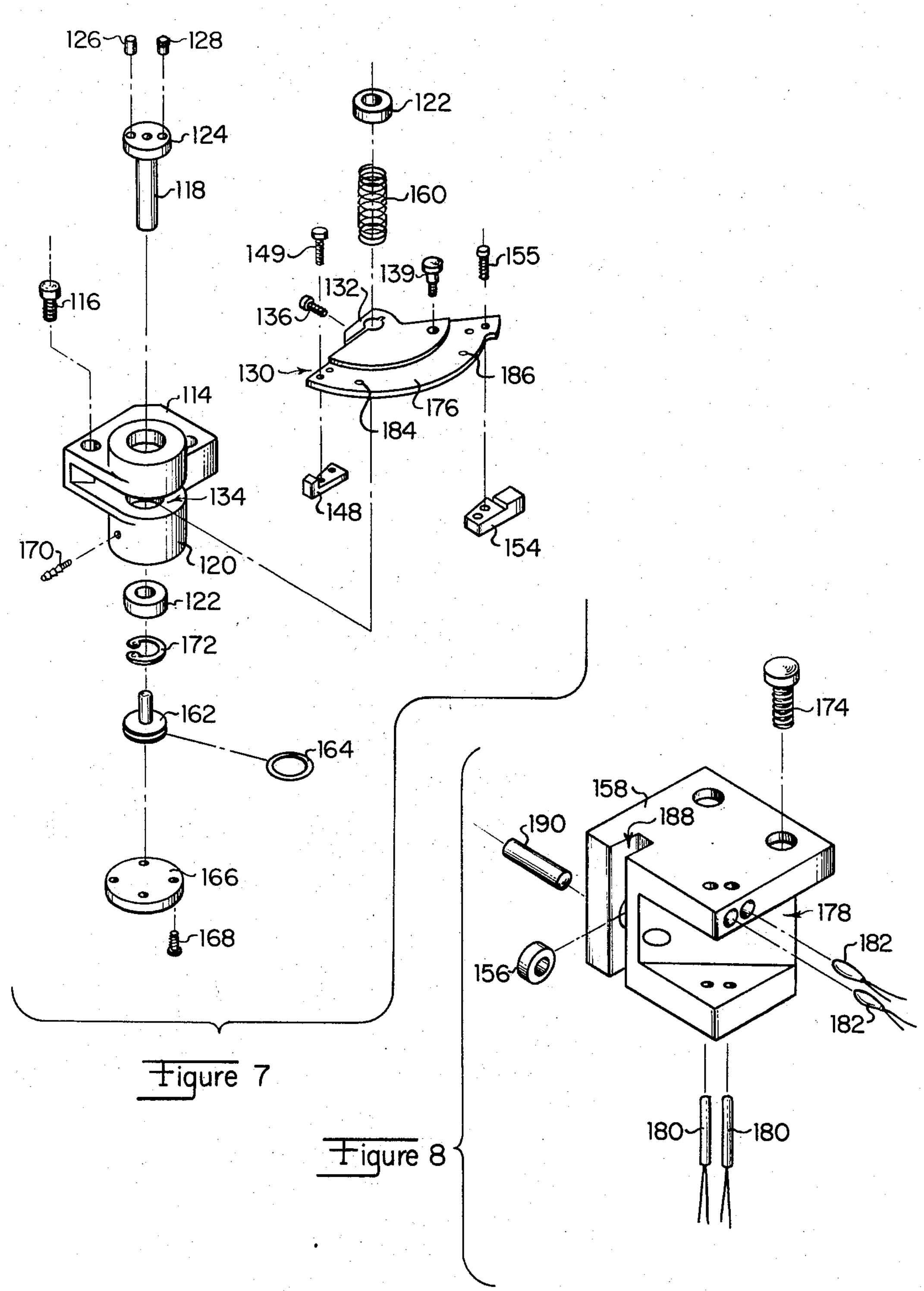
FIG. 7 is an exploded perspective view of the transfer arm mount assembly of FIGS. 1 and 2.
FIG. 8 is an exploded perspective view of the transfer arm position detection assembly of FIGS. 1 and 2.

As best shown in FIGS. 1, 2, and 7, transfer arm mount assembly 88 includes an arm mount block 114 secured to recessed portion 90 of base plate 12 by screws 116. It also includes a cylindrical shaft 118 coaxially and rotatably supported within a cylindrical portion 120 of arm mount block 114 by a pair of bearings 122, which are fixedly mounted within cylindrical portion 120. Shaft 118 has a circular head 124 on which a cylindrical pin 126 and a diamond-shaped pin 128 are mounted. Transfer arm 86 is precisely located on the head 124 of shaft 118 by the pins 126 and 128 and is fixedly held in place by thumb screw 87.

Transfer arm mount assembly 88 further includes a transfer arm position indicator 130 having a split hub 132 fixedly clamped to shaft 118 at an opening 134 in the cylindrical portion 120 of arm mount block 114 by a screw 136. A link 138 is pivotally secured at one end to one side of transfer arm position indicator 130 by a screw 139 and is fixedly secured at the other end to a piston 140 of an air cylinder 142, which is in turn secured to an inclined side portion 144 of base plate 12. Thus, by selectively applying air pressure to conduits 146 of air cylinder 142, transfer arm position indicator 130 and, hence, shaft 118 and transfer arm 86 attached thereto may be rotated either clock-wise or counter-clockwise a limited amount about the vertical axis of shaft 118.

A stop member 148 is fixedly attached at one side of transfer arm position indicator 130 by screws 149. Stop member 148 is positioned to engage a bearing 150, which is rotatably mounted on a support member 152 fixedly mounted on recessed portion 90 of base plate 12, and to thereby stop the counter-clockwise rotation of transfer arm 86 when vacuum pickup cup 92 is in the wafer pickup position directly over prealignment platform 20. Another stop member 154 is fixedly attached at the other side of transfer arm position indicator 130 by screws 155. Stop member 154 is positioned to engage another bearing 156, which is rotatably mounted on a transfer arm position detection block 158 fixedly mounted on recessed portion 90 of base plate 12, and to thereby stop the clockwise rotation of transfer arm 86 when vacuum pickup cup 92 is in the wafer delivery position directly over wafer chuck 14.

A compression spring 160 is coaxially mounted on shaft 118 between the uppermost bearing 122 and transfer arm position indicator 130. Compression spring 160 spring biases transfer arm position indicator 130 and, hence, shaft 118 and transfer arm 86 to a lowered position at which vacuum pickup cup 92 rests upon prealignment platform 20 or wafer chuck 14, depending upon whether the vacuum pickup cup is in the wafer pickup or delivery position. A piston 162 is mounted within cylindrical portion 120 of arm mount block 114 below the lowermost bearing 122. An O ring 164 is placed around the peripheral edge of a base portion of piston 162 to maintain the piston in air-tight, frictional engagement with cylindrical portion 120 of arm mount block 114 and to maintain a plunger portion of the piston in engagement with the bottom end of shaft 118. Piston 162 is enclosed in cylindrical portion 120 of arm mount block 114 by a cover 166 held in air-tight engagement with the bottom end of cylindrical portion 120 by screws 168.

An air fitting 170 is screwed into cylindrical portion 120 of arm mount block 114 in communication with an air cylinder formed between cover 166 and the base portion of piston 162. Thus, by applying air pressure to air fitting 170 from the source of air, piston 162 and, hence, shaft 118 and transfer arm 86 are raised until the base portion of piston 162 abuts upon a stop ring 172, which is fixedly mounted within the cylindrical portion 120 of arm mount block 114 below the lowermost bearing 122. In this raised position, transfer arm 86 and vacuum pickup cup 92 may be rotated without obstruction to move the vacuum pickup cup between the wafer pickup and delivery positions. When the air pressure is removed from air fitting 170, compression spring 160 returns transfer arm 86, shaft 118, and, hence, piston 162 to the lowered position. A projection on the bottom of the base portion of piston 162 thereupon rests upon cover 166 to prevent piston 162 from being lowered past air fitting 110.

As best shown in FIGS. 1, 2, and 8, transfer arm position detection block 158 is fixedly mounted on recessed portion 90 of base plate 12 by screws 174. It is positioned so that a peripheral portion 176 of transfer arm position indicator 130 (see FIG. 7) passes through a recessed portion 178 thereof. The photodiodes 180 are mounted in a lower portion of transfer arm position detection block 158 directly beneath the path of the peripheral portion 176 of transfer arm position indicator 130 and directly beneath two light sources 182, which are mounted in an upper portion of the transfer arm position detection block. The presence of transfer arm 86 and vacuum pickup cup 92 in the wafer pickup position is detected by arranging one of the photodiodes 180 and one of the light sources 182 for alignment with a corresponding aperture 184 in the peripheral portion 176 of transfer arm position indicator 130, when the transfer arm and vacuum pickup cup are in the wafer pickup position. Similarly, the presence of tranfer arm 86 and vacuum pickup cup 92 in the wafer delivery position is detected by arranging the other of the photodiodes 180 and the other of the light sources 182 for alignment with a corresponding aperture 186 in the peripheral portion 176 of transfer arm position indicator 130, when the transfer arm and the vacuum pickup cup are in the wafer delivery position. The bearing 156 engaged by stop member 154 of the transfer arm position indicator 130, when transfer arm 86 and vacuum pickup cup 92 are in the wafer delivery position, is rotatably mounted in a recessed portion 188 of transfer arm position detection block 158 by a dowel pin 190.

Referring now to FIGS. 1, 2, 6, 7, and 8, air pressure is normally applied to air fitting 170 of arm mount block 114, and piston 140 of air cylinder 142 is normally retracted so that transfer arm 86 and vacuum pickup cup 92 are normally in the raised wafer pickup position. Following detection of the presence of vacuum pickup cup 92 in this position and a succeeding time delay sufficient for completion of the prealignment operation, the air pressure applied to eir fitting 170 of arm mount block 114 is removed so that the outer peripheral portion of the vacuum pickup cup is lowered into contact with the outer peripheral portion of the upper surface of a prealigned semiconductive wafer on prealignment platform 20. A vacuum sufficient to lift a weight about five times that of a semiconductive wafer is applied through air fitting 110 to the flexible belows-like pickup member 112 of vacuum pickup cup 92 so that the prealigned semiconductive wafer is vacuum clamped to the vacuum pickup cup. In addition, the vacuum applied through apertures 58 in prealignment platform 20 to the lower surface of the prealigned semiconductive wafer is replaced by air pressure. Air pressure is then once again applied to air fitting 170 of arm mount block 114 to raise vacuum pickup cup 92 and the prealigned semiconductive wafer vacuum clamped thereto. Piston 140 of air cylinder 142 is thereupon extended to rotate vacuum pickup cup 92 and the prealigned semiconductive wafer to the raised wafer delivery position. Upon detection of the presence of vacuum pickup cup 92 in the wafer delivery position, the air pressure applied to air fitting 170 of arm mount block 114 is once again removed so that the vacuum pickup cup lowers the prealigned semiconductive wafer vacuum clamped thereto onto wafer chuck 14. Vacuum is applied through apertures 192 in wafer chuck 14 to the lower surface of the prealigned semiconductive wafer to vacuum clamp the prealigned semiconductive wafer in place on the wafer chuck. In addition, the vacuum applied through air fitting 110 of vacuum pickup cup 92 to the upper surface of the prealigned semiconductive wafer is replaced by air pressure. Air pressure is then once again applied to air fitting 170 of arm mount block 114 so that vacuum pickup cup 92 is returned to the raised wafer delivery position. Piston 140 of air cylinder 142 is thereupon retracted to return vacuum pickup cup 92 to the raised wafer pickup position and thereby begin the next wafer transfer cycle.

The prealigned semiconductive wafer vacuum clamped on wafer chuck 14 is further aligned with the photomask by manipulating the optical alignment stage on which wafer chuck 14 is mounted. A film of photoresist material on the upper surface of the aligned semiconductive wafer is thereupon exposed through the photomask to define a desired circuit pattern on the semiconductive wafer. Following these alignment and exposure operations, the vacuum applied through apertures 192 in wafer chuck 14 to the lower surface of the semiconductive wafer is replaced by air pressure to provide an air cushion for moving the semiconductive wafer to air bearing track 24, which in turn moves the semiconductive wafer into magazine 26 for storage therein.

I claim:

1. Apparatus for orienting a workpiece in a selected position, said apparatus comprising:
holder means for holding the workpiece;
drive means for engaging a rounded portion of a peripheral edge of the workpiece to rotate the workpiece in a first rotary direction towards the selected position and, when the workpiece reaches the selected position, for engaging a flat portion of the peripheral edge of the workpiece to maintain the workpiece in the selected position; and
transfer means for transferring the workpiece in the selected position from the holder means to a work station.

2. Apparatus as in claim 1 wherein:
said holder means comprises a prealignment platform for holding the workpiece;
said drive means comprises first drive means positioned adjacent to a peripheral portion of the prealignment platform for engaging the rounded portion of the peripheral edge of the workpiece to rotate the workpiece in the first rotary direction towards the selected position;
said drive means further comprises second drive means positioned adjacent to said peripheral portion of the prealignment platform to rotate the workpiece in a second rotary direction opposite from the first rotary direction, said first and second drive means engaging the flat portion of the peripheral edge of the workpiece, when the workpiece reaches the selected position, to counteract one another and maintain the workpiece in the selected position.

3. Apparatus as in claim 2 wherein said prealignment platform includes means for producing a cushion of air on the prealignment platform under the workpiece while the workpiece is being rotated to the selected position.

4. Apparatus as in claim 1 wherein said transfer means comprises:
a transfer arm pivotally mounted for movement between the holder means and the work station; and
vacuum pickup means coupled to the transfer arm for picking up the workpiece at the holder means and for depositing the workpiece at the work station.

5. Apparatus as in claim 4 wherein said vacuum pickup means comprises:
an inverted outer member for fitting over the workpiece; and
means for applying a vacuum to the workpiece within the inverted outer member.

6. Apparatus as in claim 1 wherein said drive means comprises:
a plurality of spaced-apart rollers with their longitudinal axes extending in a vertical direction; and
means for driving each of said rollers about its longitudinal axis, a first one of said rollers being driven to rotate the workpiece in the first rotary direction and a second one of said rollers being driven to rotate the workpiece in a second rotary direction opposite from the first rotary direction.

7. Apparatus as in claim 6 wherein said holder means comprises:
a prealignment platform for holding the workpiece; and
means for producing a cushion of air on the prealignment platform under the workpiece while the workpiece is being rotated to the selected position.

8. Apparatus as in claim 7 wherein:
said transfer means comprises a transfer arm pivotally mounted for movement between the prealignment platform and the work station; and
vacuum pickup means coupled to the transfer arm for picking up the workpiece at the prealignment platform and for depositing the workpiece at the work station.

9. Apparatus as in claim 8 wherein said vacuum pickup means comprises:
an inverted outer member for fitting over the workpiece; and
means for applying a vacuum to the workpiece within the inverted outer member.

10. Apparatus as in claim 1 wherein said holder means comprises:
a pivotally mounted prealignment platform for holding the workpiece; and
means for tilting the prealignment platform towards the drive means to move the workpiece held by the prealignment platform into engagement with the drive means and for subsequently returning the prealignment platform to its untilted position.

11. Apparatus as in claim 10 wherein said prealignment platform includes means for vacuum clamping the workpiece to the prealignment platform while it is being tilted towards the drive means, for thereafter producing a cushion of air on the prealignment platform under the workpiece while the workpiece is being rotated to the selected position, and for thereafter vacuum clamping the workpiece in the selected position to the prealignment platform while the prealignment platform is returned to its untilted position.

12. Apparatus as in claim 10 wherein said drive means comprises:
a plurality of spaced-apart rollers with their longitudinal axes extending in a vertical direction; and
means for driving each of said rollers about its longitudinal axis, a first one of said rollers being driven to rotate the workpiece in the first rotary direction and a second one of said rollers being driven to rotate the workpiece in a second rotary direction opposite from the first rotary direction.

13. Apparatus as in claim 10 including means for moving the workpiece from a loading station onto the prealignment platform and for moving the workpiece from the work station to an unloading station.

14. Apparatus as in claim 10 wherein said transfer means comprises:
a transfer arm pivotally mounted for movement between the prealignment platform and the work station; and
vacuum pickup means coupled to the transfer arm for picking up the workpiece at the prealignment platform and for depositing the workpiece at the work station.

15. Apparatus as in claim 14 wherein said vacuum pickup means comprises:
an inverted outer member for fitting over the workpiece; and
means for applying a vacuum to the workpiece within the inverted outer member.

16. Apparatus as in claim 1 wherein said drive means comprises:
a center drive roller and two outer drive rollers; and
means for driving the center drive roller and one of the outer drive rollers in the first rotary direction and for driving the other of the outer drive rollers in a second rotary direction opposite from the first rotary direction, at least one of said center drive roller and said one of the outer drive rollers being positioned for engaging the rounded portion of the peripheral edge of the workpiece to rotate the workpiece towards the selected position, and said outer drive rollers being positioned to engage the flat portion of the peripheral edge of the workpiece, when the workpiece is in the selected position, to counteract one another and maintain the workpiece in the selected position.

17. Apparatus as in claim 16 wherein said holder means comprises:
a pivotally mounted prealignment platform for holding the workpiece; and
means for tilting the prealignment platform towards said one of the outer drive rollers to move the workpiece help by the prealignment platform into engagement with at least one of said center drive roller and said one of the outer drive rollers and for subsequently returning the prealignment platform to its untilted position, said prealignment platform including means for vacuum clamping the workpiece to the prealignment platform while it is being tilted towards said one of the outer drive rollers, for thereafter producing a cushion of air on the prealignment platform under the workpiece while the workpiece is being rotated to the selected position, and for thereafter vacuum clamping the workpiece in the selected position to the prealignment platform while the prealignment platform is returned to its untilted position.

18. Apparatus as in claim 17 wherein said transfer means comprises:
a transfer arm pivotally mounted for movement between the prealignment platform and the work station; and
vacuum pickup means coupled to the transfer arm for picking up the workpiece at the prealignment platform and for depositing the workpiece at the work station.

19. Apparatus as in claim 18 wherein said vacuum pickup means comprises:
an inverted outer member for fitting over the workpiece; and means for applying a vacuum to the workpiece within the inverted outer member.

20. Apparatus as in claim 19 wherein said center drive roller and said outer drive rollers are mounted adjacent to a peripheral edge of the prealignment platform.

21. Apparatus as in claim 20 including:
means for moving a workpiece from a loading station onto the prealignment platform; and
means for moving the workpiece from the work station to an unloading station.

22. A prealignment system for positioning a semiconductive wafer in a prealigned position with respect to a wafer chuck, said prealignment system comprising:
a pivotally-mounted prealignment platform for holding the semiconductive wafer while it is being prealigned with respect to the wafer chuck;
a plurality of drive rollers positioned along a peripheral portion of the prealignment platform with their longitudinal axes extending in a vertical direction;
means for driving each of the drive rollers in a rotary direction about its longitudinal axis;
means for tilting the prealignment platform towards the drive rollers to move the semiconductive wafer held by the prealignment platform into engagement with a first one of the drive rollers at a peripheral edge of the semiconductive wafer and for subsequently returning the prealignment platform to its untilted position;
said first one of the drive rollers being driven in one rotary direction to rotate the semiconductive wafer in a first rotary direction toward the prealigned position at which a flat portion of the peripheral edge of the semiconductive wafer engages the first one and a second one of the drive rollers;
said first and second ones of the drive rollers being driven in opposite rotary directions to counteract one another and thereby maintain the semiconductive wafer in the prealigned position once it has been rotated thereto by the first drive roller; and
transfer means for transferring the prealigned semiconductive wafer from the prealignment platform to the wafer chuck.

23. A prealignment system as in claim 22 wherein said prealignment platform includes means for vacuum clamping the semiconductive wafer to the prealignment platform while it is being tilted towards the drive rollers, for thereafter producing a cushion of air on the prealignment platform under the semiconductive wafer while the semiconductive wafer is being rotated to the prealigned position, and for thereafter vacuum clamping the semiconductive wafer in the prealigned position to the prealignment platform while the prealignment platform is returned to its untilted position.

24. A prealignment system as in claim 23 wherein said transfer means comprises:
a transfer arm pivotally mounted for movement between the prealignment platform and the wafer chuck; and
vacuum pickup means coupled to the transfer arm for picking up the prealigned semiconductive wafer at the prealignment platform and for depositing the prealigned semiconductive wafer at the wafer chuck.

25. A prealignment system as in claim 24 wherein said vacuum pickup means comprises:

an inverted outer member for fitting over the prealigned semiconductive wafer; and means for applying a vacuum to the prealigned semiconductive wafer within the inverted outer member.

26. A prealignment system as in claim 25 including means for moving the semiconductive wafer from a loading station onto the prealignment platform and for moving the semiconductive wafer from the wafer chuck to an unloading station.

* * * * *

UNITED STATES PATENT OFFICE
CERTIFICATE OF CORRECTION

Patent No. 3,865,254 Dated February 11, 1975

Inventor(s) Karl-Heinz Johannsmeier

It is certified that error appears in the above-identified patent and that said Letters Patent are hereby corrected as shown below:

On the title page, section [73], "Kasker" should read -- Kasper --;

Column 2, line 37, "aforementined" should read -- aforementioned --;

Column 2, line 56, "a" should read -- the -- and "the" should read -- a --;

Column 2, line 62, after "platform" insert -- . Apertures are provided in the prealignment platform --;

Column 6, lines 6-7, "position" should read --rotation --;

Column 6, line 16, "Te" should read -- The --;

Column 6, line 64, "clock-wise" should read -- clockwise --;

Column 7, line 6, "counter-clockwise" should read -- counterclockwise --;

Column 7, line 62, "The" should read -- Two --;

Column 8, line 9, "tranfer" should read -- transfer --;

Column 8, line 30, "eir" should read -- air --;

UNITED STATES PATENT OFFICE
CERTIFICATE OF CORRECTION

Patent No. 3,865,254 Dated February 11, 1975

Inventor(s) Karl-Heinz Johannsmeier Page 2

It is certified that error appears in the above-identified patent and that said Letters Patent are hereby corrected as shown below:
con't.

Column 9, line 9, "circiut" should read -- circuit --; and

Column 11, line 39, "help" should read -- held --.

Signed and sealed this 1st day of July 1975.

(SEAL)
Attest:

RUTH C. MASON
Attesting Officer

C. MARSHALL DANN
Commissioner of Patents
and Trademarks